United States Patent
Sato et al.

(10) Patent No.: US 8,384,433 B2
(45) Date of Patent: Feb. 26, 2013

(54) SEMICONDUCTOR DEVICE GENERATING COMPLEMENTARY OUTPUT SIGNALS

(75) Inventors: Takenori Sato, Tokyo (JP); Hideaki Kato, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 13/064,718

(22) Filed: Apr. 11, 2011

(65) Prior Publication Data

US 2011/0267099 A1    Nov. 3, 2011

(30) Foreign Application Priority Data

Apr. 28, 2010    (JP) .................................. 2010-103036

(51) Int. Cl.
*H03K 19/0175*    (2006.01)
*H03B 1/00*    (2006.01)

(52) U.S. Cl. ................. 326/82; 326/83; 326/86; 326/87; 327/108; 327/109

(58) Field of Classification Search .................. 326/104, 326/106, 108, 114, 119, 121, 82–87, 30, 326/37–41, 47, 101
See application file for complete search history.

(56) References Cited

U.S. PATENT DOCUMENTS

| | | | |
|---|---|---|---|
| 6,087,854 A * | 7/2000 | Potter | 326/83 |
| 7,843,222 B1 * | 11/2010 | Shiah et al. | 326/81 |
| 2004/0196067 A1 * | 10/2004 | Hossain et al. | 326/112 |
| 2005/0040845 A1 * | 2/2005 | Park | 326/30 |
| 2008/0106299 A1 * | 5/2008 | Oh | 326/33 |
| 2009/0195281 A1 * | 8/2009 | Tamura et al. | 327/163 |
| 2011/0050303 A1 * | 3/2011 | Ma | 327/158 |
| 2011/0156748 A1 * | 6/2011 | Jeon et al. | 326/16 |

FOREIGN PATENT DOCUMENTS

JP    2008-112565    5/2008

* cited by examiner

*Primary Examiner* — Thienvu Tran
(74) *Attorney, Agent, or Firm* — McGinn IP Law Group, PLLC

(57) ABSTRACT

To include a first inverter that receives an input signal to output an inverted signal, a second inverter that receives the inverted signal to output a first internal signal, and a third inverter that receives the input signal and outputs a second internal signal by using the inverted signal as a power supply. According to the present invention, because a signal on one signal path is used as a power supply of an inverter included in the other signal path, phases of a pair of output signals based on the input signal can be exactly matched without adding a capacitor or a resistor for adjustment.

20 Claims, 8 Drawing Sheets

SEMICONDUCTOR DEVICE GENERATING COMPLEMENTARY OUTPUT SIGNALS

BACKGROUND OF THE INVENTION

1. Field of the Invention

The present invention relates to a semiconductor device, and more particularly relates to a semiconductor device that generates complementary output signals based on an input signal.

2. Description of Related Art

Types of signals transmitted inside a semiconductor device include single-ended signals and differential signals. The single-ended signal is a signal of a type that represents 1 bit using one signal wiring, and the single-ended signals are mostly used for control system signals such as clock signals, address signals, and command signals. On the contrary, the differential signal is a signal of a type that represents 1 bit using two (a pair of) signal wirings, and the differential signals are mostly used for data system signals such as an output of a sense amplifier.

However, the differential signals are also used in control system signals, particularly in a circuit part that requires high speed operations. For example, in a high-speed DRAM (Dynamic Random Access Memory), a DLL (Delay Locked Loop) circuit that generates phase-controlled internal clock signals is used and read data is output in synchronization with the internal clock signals. The internal clock signals generated by the DLL circuit are single-ended signals; however, the internal clock signals are converted into differential signals near an output driver and the read data is output in synchronization with the differential internal clock signals. A so-called splitter circuit is used for such conversion of internal clock signals.

The splitter circuit is a circuit that splits an input signal into two signal paths and outputs an in-phase signal from one signal path and a reverse-phase signal from the other signal path. Both of the signal paths are formed of a plurality of cascade connected inverters, and the signal path that outputs an in-phase signal includes inverters of even numbered stages and the signal path that outputs a reverse-phase signal includes inverters of odd numbered stages. A strobe output buffer 51 shown in FIG. 3 of Japanese Patent Application Laid-open No. 2008-112565 can be mentioned as an example of the splitter circuit.

However, because two signal paths that form the splitter circuit respectively include inverters of different number of stages, there is a problem that the phases of the generated in-phase signal and the reverse-phase signal do not exactly match. To solve this problem, there has been proposed a method in which a capacitor or a resistor for adjustment are added in each signal path; however, even if a capacitance value and a resistance value are designed to match the phases of the in-phase signal and the reverse phase signal, inmost cases, these phases do not exactly match when actually manufactured. Therefore, a trial and error approach is taken in which the capacitance value and the resistance value are changed for many times. However, whenever these values are changed, it becomes necessary to change a mask, and this leads to an increase of its designing cost.

Furthermore, even though these phases are matched according to the design, phase shifting occurs not only due to variations in a manufacturing process but also due to in a temperature change, fluctuations in a power supply voltage or the like after manufacturing.

SUMMARY

In one embodiment, there is provided a semiconductor device that includes: a first inverter that receives an input signal to output an inverted signal; a second inverter that receives the inverted signal to output a first output signal; and a third inverter that receives the input signal to output a second output signal by using the inverted signal as a power supply.

In another embodiment, there is provided a semiconductor device that includes: a first signal path that generates a first output signal from an input signal; and a second signal path that generates a second output signal complementary with the first output signal from the input signal, wherein the first signal path includes one more stages of logic circuits than the second signal path, and the second signal path includes a predetermined logic circuit that operates by using an output of a predetermined logic circuit included in the first signal path as a power supply.

According to the present invention, because a signal on one of the signal paths is used as a power supply of a circuit included in the other signal path, phases of a pair of output signals can be exactly matched without adding a capacitor or a resistor for adjustment.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
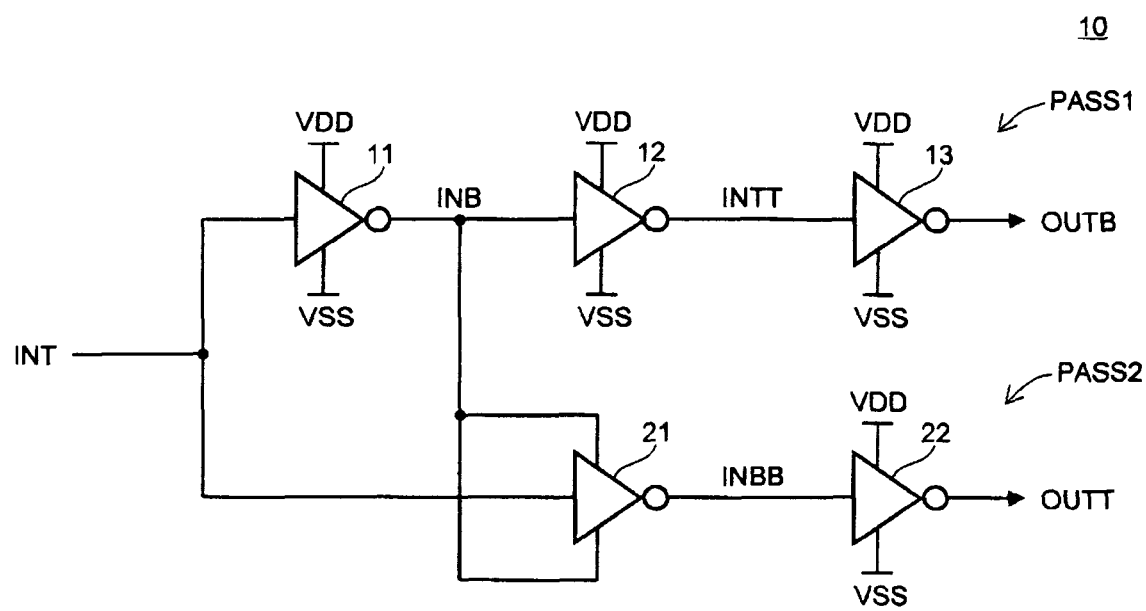
FIG. 1 is a circuit diagram showing a splitter circuit 10 according to an embodiment of the present invention.

FIG. 1 is a circuit diagram showing a splitter circuit 10 according to an embodiment of the present invention.

As shown in FIG. 1, the splitter circuit 10 according to the present embodiment is a circuit that receives an input signal INT and generates complementary output signals OUTB and OUTT. The splitter circuit 10 includes a signal path PASS1 that generates the output signal OUTB from the input signal INT, and a signal path PASS2 that generates the output signal OUTT from the input signal INT. The signal path PASS1 is a path that generates the output signal OUTB having a reverse phase to that of the input signal INT, and includes three inverters 11, 12, and 13 that are cascade connected. On the other hand, the signal path PASS2 is a path that generates the output signal OUTT having the same phase as the input signal INT, and includes two inverters 21 and 22 that are cascade connected. In this manner, the number of stages of logic circuits included in the signal path PASS1 exceeds by one than the number of stages of logic circuits included in the signal path PASS2.

Among the inverters that constitute the splitter circuit 10, a voltage between a power supply VDD and a power supply VSS functions as an operation power supply for the inverters 11 to 13, and 22. On the contrary, an inverted signal INB that is an output of the inverter 11 functions as an operation power supply for the inverter 21. With this configuration, phases of an internal signal INTT that is an output of the inverter 12, and an internal signal INBB that is an output of the inverter 21 match irrespective of a difference in the number of stages of logic circuits of the signal paths PASS1 and PASS2. A circuit configuration and operations of the splitter circuit 10 according to the present embodiment are explained below in detail.

Figure 2:
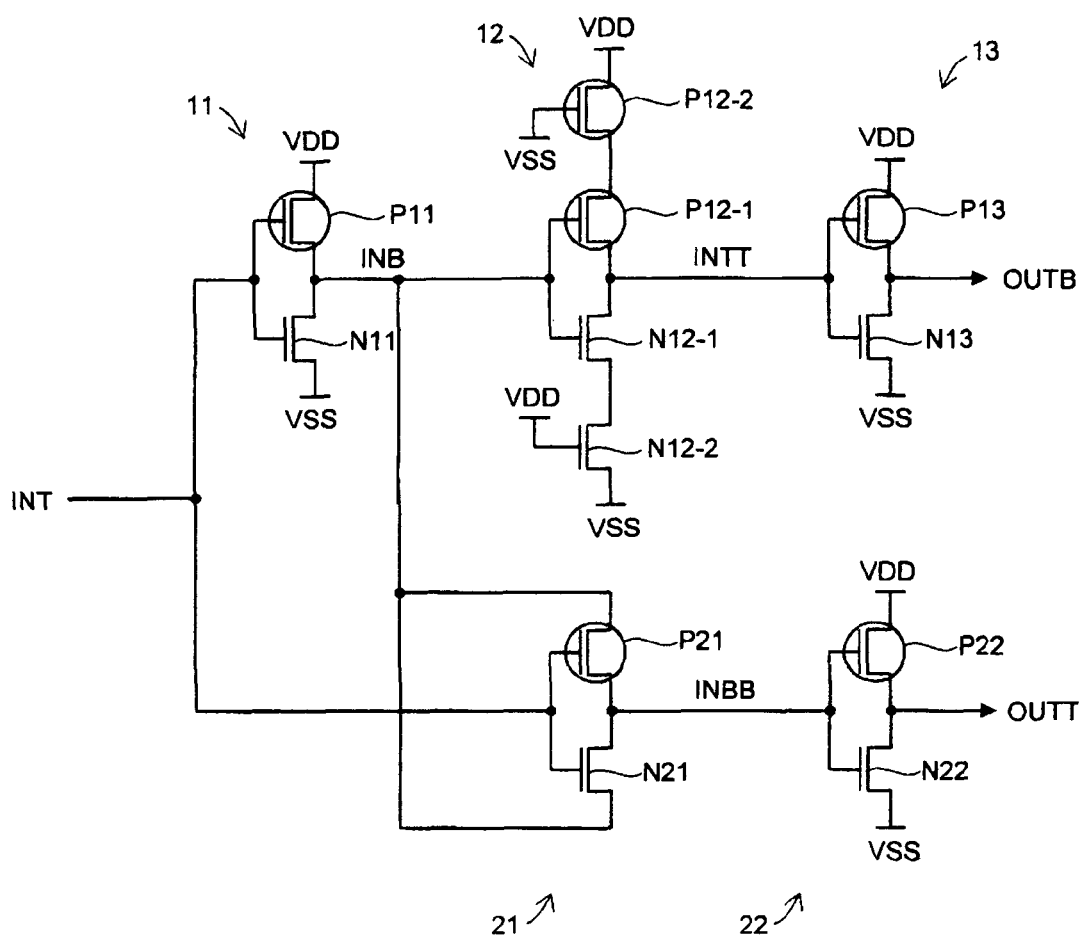
FIG. 2 is a more specific circuit diagram of the splitter circuit 10.

FIG. 2 is a more specific circuit diagram of the splitter circuit 10.

As shown in FIG. 2, each of the inverters is constituted by a series circuit of a P-channel MOS transistor (one conductivity type transistor) and an N-channel MOS transistor (opposite conductivity type transistor). Respective inverters are specifically explained below.

The inverter 11 is constituted by a series circuit of transistors P11 and N11. Sources of the transistors P11 and N11 are respectively connected to the power supplies VDD and VSS, and the input signal INT is commonly supplied to gate electrodes of the transistors P11 and N11. The inverted signal INB is output from a common drain of the transistors P11 and N11.

The inverter 12 includes a series circuit of transistors P12-1 and N12-1, and the inverted signal INB is commonly supplied to gate electrodes of the transistors P12-1 and N12-1. The internal signal INTT is output from a common drain of the transistors P12-1 and N12-1. Furthermore, a transistor P12-2 is connected between a source of the transistor P12-1 and the power supply VDD. The power supply VSS is supplied to a gate electrode of the transistor P12-2. Thus, the transistor P12-2 is fixed in an on-state. Further, a transistor N12-2 is connected between a source of the transistor N12-1 and the power supply VSS. The power supply VDD is supplied to a gate electrode of the transistor N12-2, and thus the transistor N12-2 is fixed in an on-state.

The inverter 13 is constituted by a series circuit of transistors P13 and N13. Sources of the transistors P13 and N13 are respectively connected to the power supplies VDD and VSS. The internal signal INTT is commonly supplied to gate electrodes of the transistors P13 and N13. The output signal OUTB is output from a common drain of the transistors P13 and N13. The inverter 13 is a circuit for securing fan-out, and thus it is not essential to provide the inverter 13 in the present invention.

The inverter 21 is constituted by a series circuit of transistors P21 and N21. Sources of the transistors P21 and N21 are connected to an output terminal (a common drain) of the inverter 11. The input signal INT is commonly supplied to gate electrodes of the transistors P21 and N21. The internal signal INBB is output from a common drain of the transistors P21 and N21.

The inverter 22 is constituted by a series circuit of transistors P22 and N22. Sources of the transistors P22 and N22 are respectively connected to the power supplies VDD and VSS, and the internal signal INBB is commonly supplied to gate electrodes of the transistors P22 and N22. The output signal OUTT is output from a common drain of the transistors P22 and N22. The inverter 22 is a circuit for securing fan-out, and thus it is not essential to provide the inverter 22 in the present invention.

In the present embodiment, channel widths of the N-channel MOS transistors N11, N12-1, N12-2, and N21 are designed to be equal. Therefore, on resistances of the N-channel MOS transistors N11, N12-1, N12-2, and N21 are equal. Similarly, channel widths of the P-channel MOS transistors P11, P12-1, P12-2, and P21 are designed to be equal. Therefore, on resistances of the P-channel MOS transistors P11, P12-1, P12-2, and P21 are equal. Further, because the on resistances of the N-channel MOS transistor and the P-channel MOS transistor constituting the same inverter are designed to be equal, the on resistances of the transistors N11, N12-1, N12-2, N21, P11, P12-1, P12-2, and P21 are equal.

Figure 3:
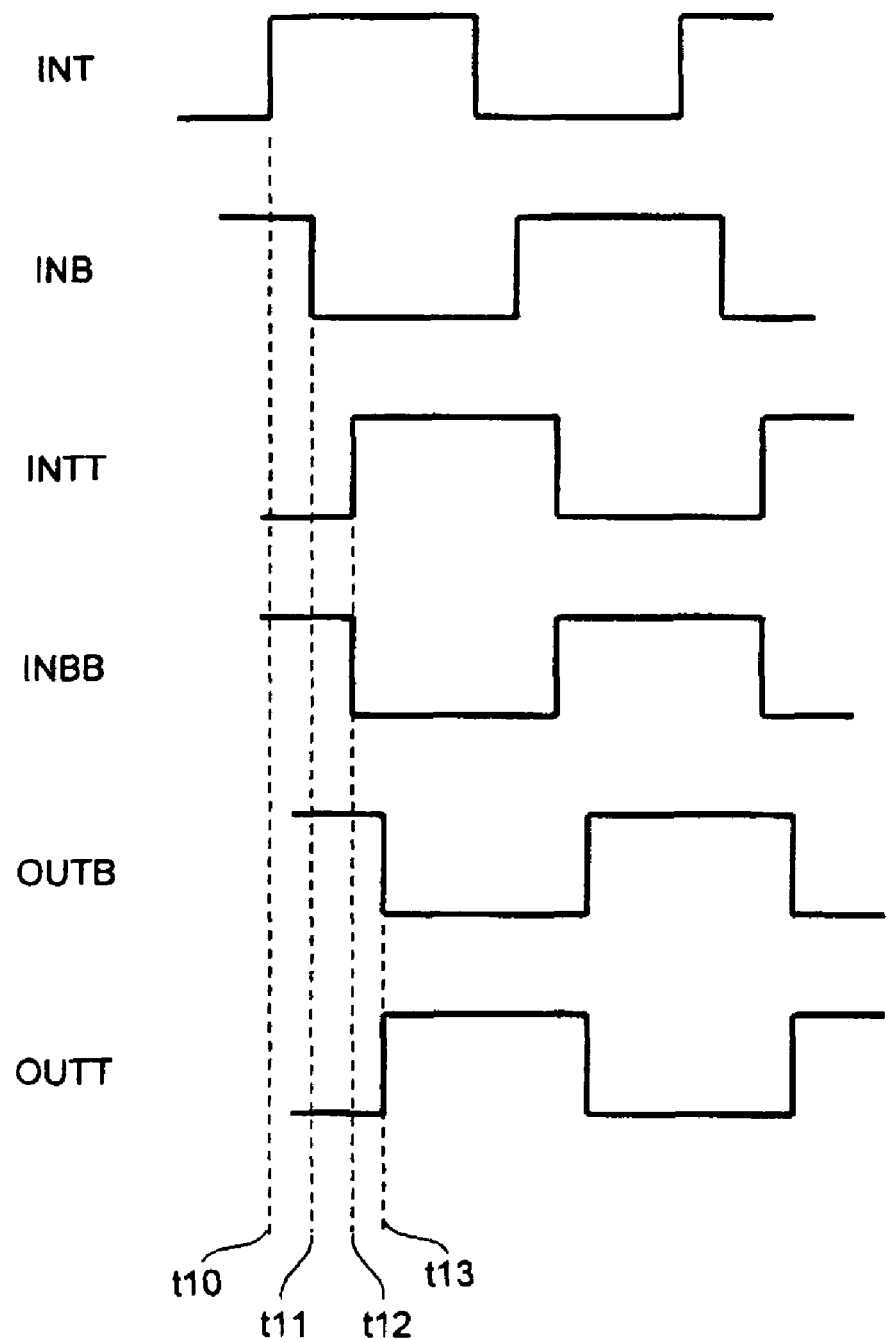
FIG. 3 is a waveform diagram for explaining operations of the splitter circuit 10.

FIG. 3 is a waveform diagram for explaining operations of the splitter circuit 10 according to the present embodiment.

As shown in FIG. 3, when the input signal INT changes from low level to high level at a time t10, the inverters 11 and 21 that receive the input signal INT seek to invert the inverted signal INB and the internal signal INBB that are the outputs of the inverters 11 and 21. However, because the inverted signal INB that is the output of the inverter 11 functions as the power supply for the inverter 21, the internal signal INBB cannot be inverted (that is, cannot be changed to low level) until the inverted signal INB changes from high level to low level. Thus, the internal signal INBB changes from high level to low level at a time t12 after the inverted signal INB changes from high level to low level at a time t11.

Because the time t12 corresponds to a timing at which the logic circuit of the subsequent stage that receives the inverted signal INB inverts after the inverted signal INB changes from high level to low level, the internal signal INTT that is the output of the inverter 12 also changes at the time t12. That is, the inverters 12 and 21 simultaneously change at the time t12. As a result, the output signal OUTB that is the output of the inverter 13 and the output signal OUTT that is the output of the inverter 22 also change simultaneously at a time t13.

Operations when the input signal INT changes from high level to low level are identical to the above ones, and finally, the output signals OUTB and OUTT change simultaneously.

A principle of the simultaneous change in the internal signal INTT as the output of the inverter 12 and the internal signal INBB as the output of the inverter 21 is explained below in more detail.

Figure 4:
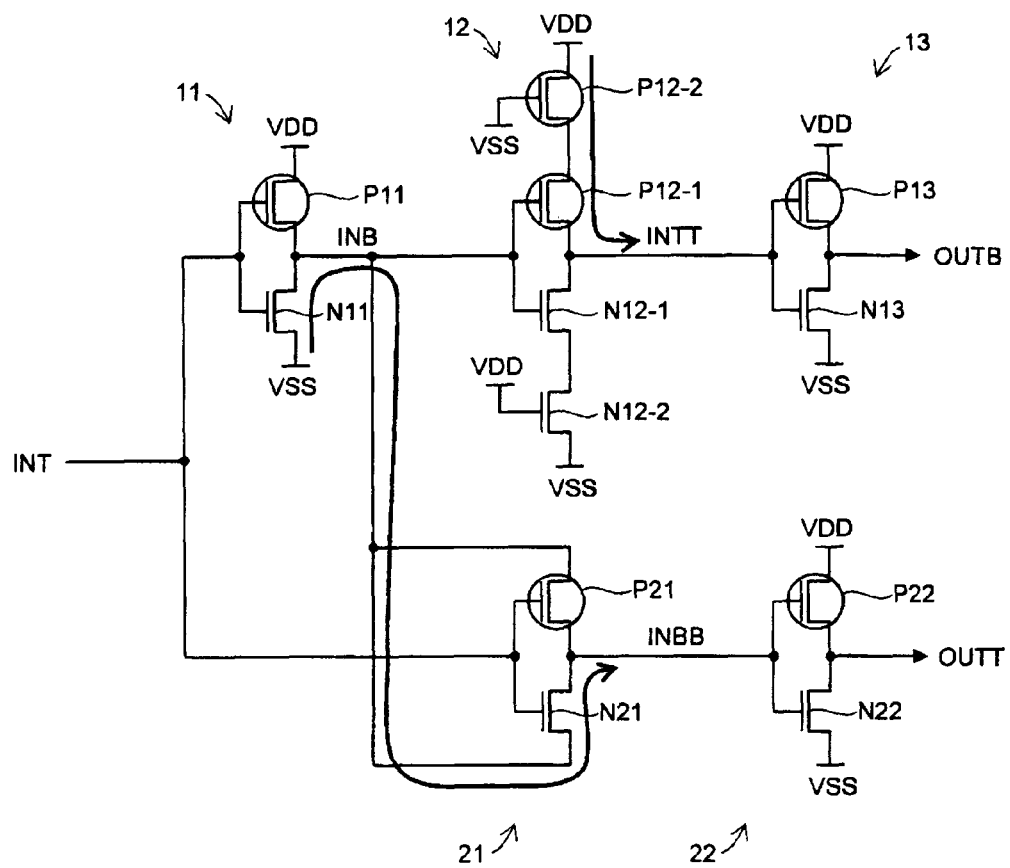
FIG. 4 is a schematic diagram for explaining operations of the splitter circuit 10.

A case where the input signal INT changes from low level to high level is examined first. In this case, because the transistor N11 included in the inverter 11 is turned on, the inverted signal INB changes from high level to low level. Considering the effects of the change in the logic circuit of the subsequent stage, as shown in FIG. 4, because the transistor P12-1 of the inverter 12 is turned on, the common drain of the transistor P12-1 that is the output terminal is connected to the power supply VDD via the transistors P12-2 and P12-1. On the other hand, because the transistor N21 of the inverter 21 is turned on, the common drain of the transistor N21 that is the output terminal is connected to the power supply VSS via the transistors N11 and N21. Thus, when a series resistance of the transistors P12-2 and P12-1 and a series resistance of the transistors N11 and N21 are designed to be equal, the internal signal INTT and the internal signal INBB inevitably change simultaneously.

Figure 5:
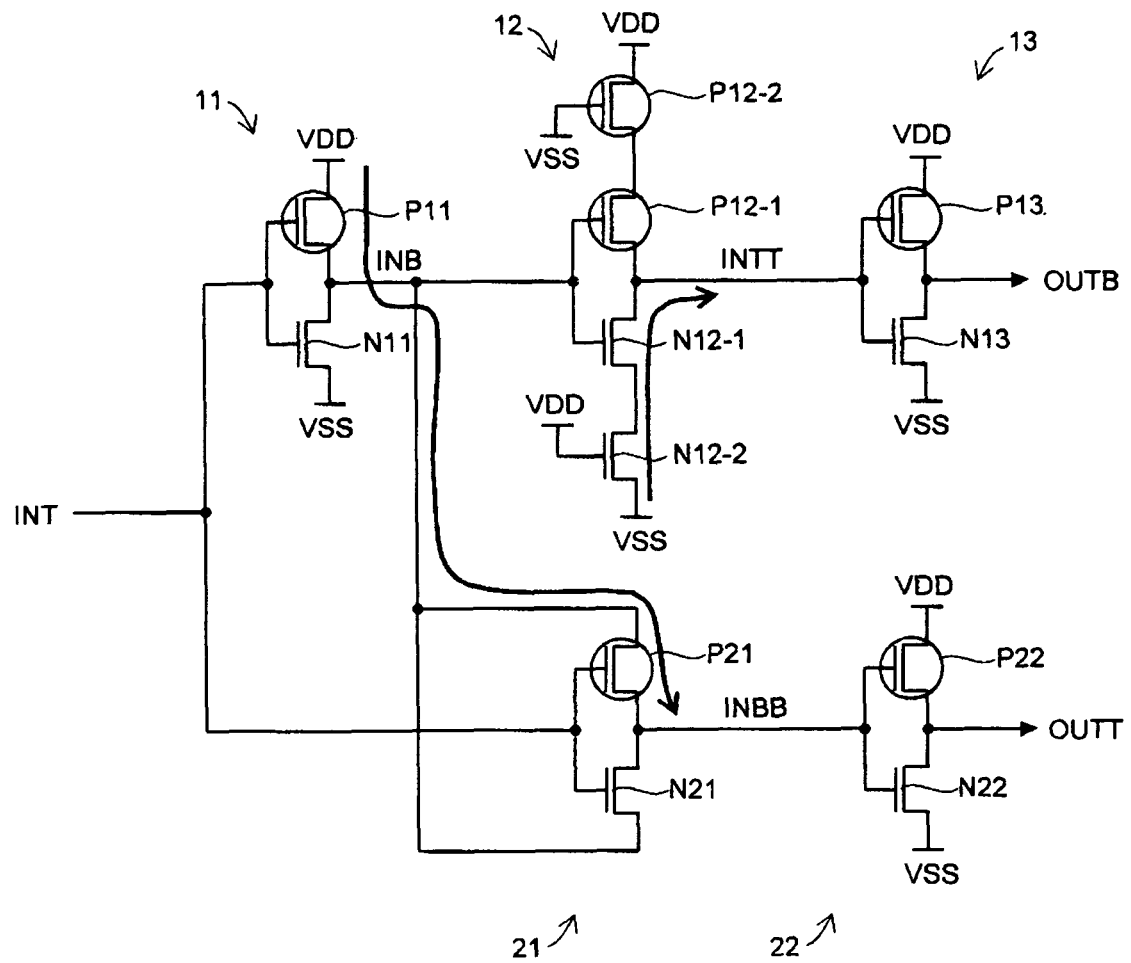
FIG. 5 is another schematic diagram for explaining operations of the splitter circuit 10.

The same holds true when the input signal INT changes from high level to low level. In this case, because the transistor P11 included in the inverter 11 is turned on, the inverted signal INB changes from low level to high level. Considering the effects of this change in the logic circuit of the subsequent stage, as shown in FIG. 5, because the transistor N12-1 of the inverter 12 is turned on, the common drain of the transistor N12-1 that is the output terminal is connected to the power supply VSS via the transistors N12-2 and N12-1. On the other hand, because the transistor P21 of the inverter 21 is turned on, the common drain of the transistor P21 that is the output terminal is connected to the power supply VDD via the transistors P11 and P21. Therefore, when a series resistance of the transistors N12-2 and N12-1 and a series resistance of the transistors P11 and P21 are designed to be equal, the internal signals INTT and INBB inevitably change simultaneously.

In this manner, because the splitter circuit 10 according to the present embodiment uses a signal on the signal path PASS1 as the power supply for the inverter 21 on the other signal path PASS2, phases of a pair of the output signals OUTB and OUTT can be exactly matched without adding a capacitor or a resistor for adjustment. As a result, repeated mask changes for changing the capacitance value and the resistance value is not required and thus its designing cost can be reduced.

Figure 6:
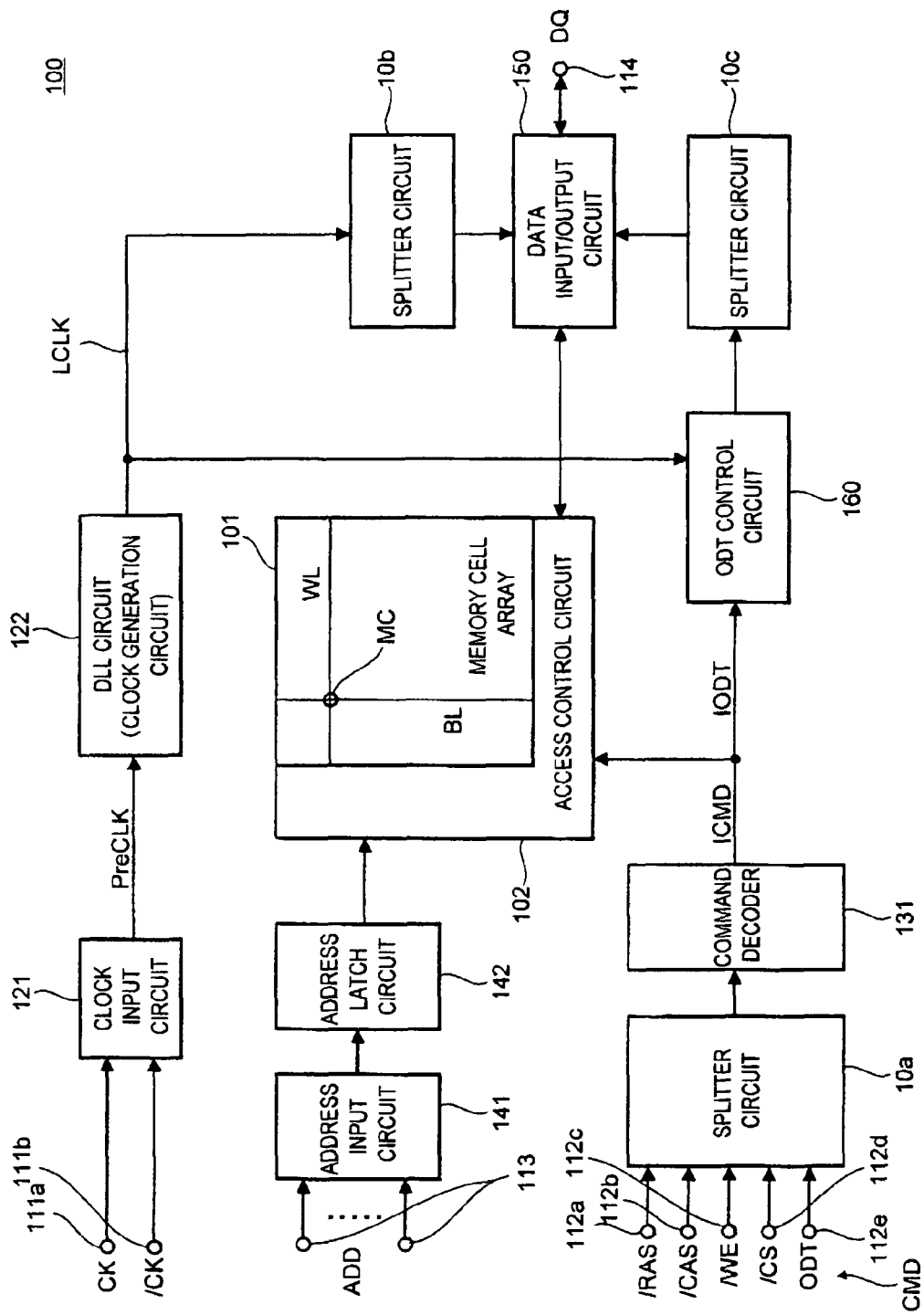
FIG. 6 is a block diagram showing an example of a semiconductor device using the splitter circuit 10.

FIG. 6 is a block diagram showing an example of a semiconductor device using the splitter circuit 10 described above.

A semiconductor device 100 according to the present embodiment is a synchronous DRAM (Dynamic Random Access Memory), and includes, as external terminals, clock terminals 111a and 111b, command terminals 112a to 112e, address terminals 113, and a data input/output terminal 114. While the semiconductor device 100 also includes a data strobe terminal, a power supply terminal or the like, these terminals are not shown in FIG. 6.

The clock terminals 111a and 111b are terminals to which external clocks CK and /CK are respectively supplied. These external clocks CK and /CK are then supplied to a clock input circuit 121. In the present specification, a signal with a "/ (slash)" at the beginning of a signal name means that the signal is an inverted signal of a corresponding signal or a low-active signal. Therefore, the external clocks CK and /CK are complementary to each other. The clock input circuit 121 generates an internal clock PreCLK based on the external clocks CK and /CK, and supplies the internal clock PreCLK to a DLL circuit 122. The DLL circuit 122 functions as a clock generation circuit that generates a phase-controlled internal clock signal LCLK based on the internal clock PreCLK, and supplies the generated internal clock signal LCLK to a splitter circuit 10b, an ODT control circuit 160 or the like.

The command terminals 112a to 112e are terminals to which a row address strobe signal /RAS, a column address strobe signal /CAS, a write enable signal /WE, a chip selection signal /CS, and an on-die termination signal ODT are respectively supplied. These command signals CMD are supplied to a command decoder 131 via a splitter circuit 10a. The command decoder 131 is a circuit that generates various internal commands ICMD that include an internal on-die termination signal IODT by performing holding, decoding, and counting of the command signals CMD. The generated internal commands ICMD are supplied to an access control circuit 102. Among the internal commands ICMD, the internal on-die termination signal IODT is supplied to a splitter circuit 10c via the ODT control circuit 160. The internal on-die termination signal IODT is a signal that causes a data input/output circuit 150 to function as a terminal resistor. The ODT control circuit 160 is a circuit that synchronizes a phase of the internal on-die termination signal IODT with a phase of the internal clock signal LCLK.

The address terminals 113 are terminals to which an address signal ADD is supplied. The address signal ADD is then supplied to an address input circuit 141. An output of the address input circuit 141 is supplied to an address latch circuit 142. A latched address signal ADD is supplied to the access control circuit 102.

The access control circuit 102 is a circuit that controls access operations to any memory cell MC included in a memory cell array 101 based on the internal commands ICMD and the address signal ADD. The memory cell MC is arranged at an intersection of a word line WL and a bit line BL. The word line WL and the bit line BL are selected based on the address signal ADD. For example, when the internal command ICMD indicates a read operation, a predetermined memory cell is selected by the address signal ADD and the read data that is read from the pertinent memory cell is output to the outside via the data input/output circuit 150 and the data input/output terminal 114. When the internal command ICMD indicates a write operation, write data that is input into the data input/output circuit 150 via the data input/output terminal 114 is written to a specified memory cell by the address signal ADD.

The splitter circuit 10 according to the present invention is used at several parts in this type of semiconductor device 100. In this example, the splitter circuit 10 is used as the splitter circuit 10a that supplies each bit of the command signals CMD to the command decoder 131, as the splitter circuit 10b that supplies the internal clock signal LCLK to the data input/output circuit 150, and as the splitter circuit 10c that supplies the internal on-die termination signal IODT to the data input/output circuit 150.

Figure 7:
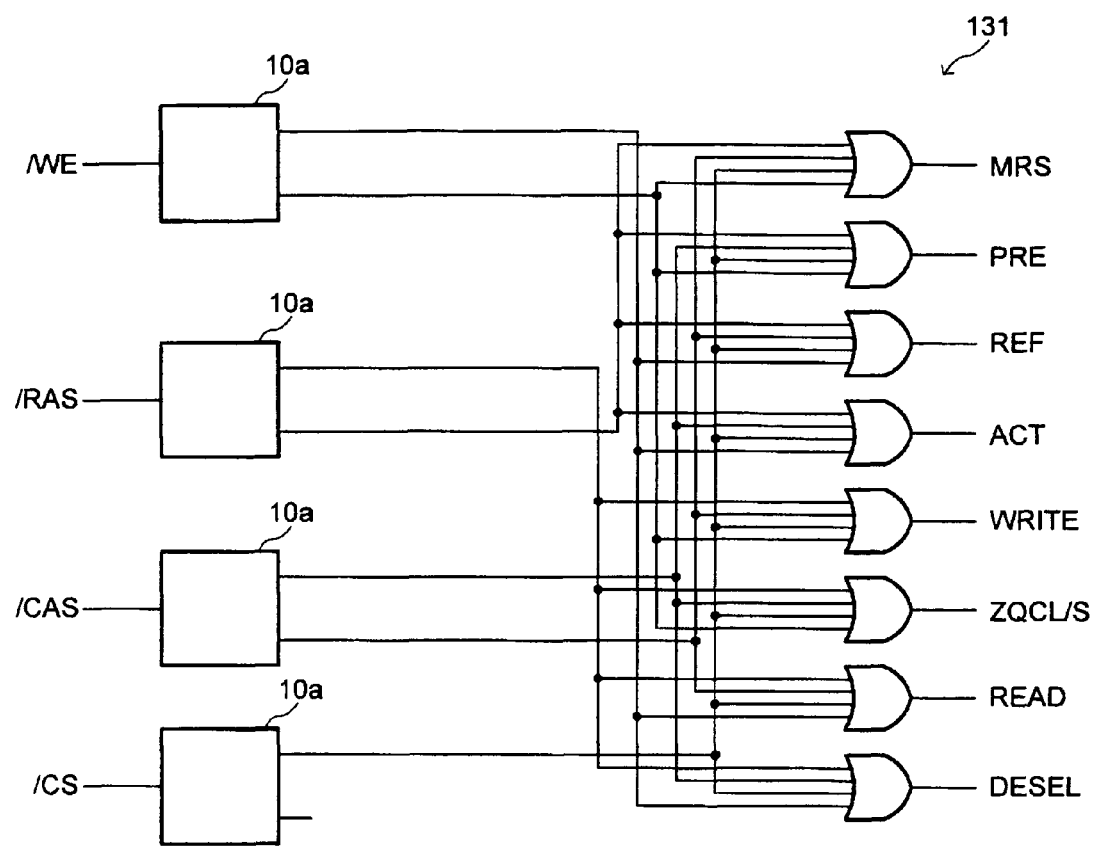
FIG. 7 is a circuit diagram showing main parts of splitter circuits 10a and a command decoder 131.

FIG. 7 is a circuit diagram showing main parts of the splitter circuit 10a and the command decoder 131. As shown in FIG. 7, the command decoder 131 activates any one of the various internal commands ICMD (such as MRS, PRE, REF, ACT, WRITE, ZQCL/S, READ, and DESEL) based on a combination of logical levels of all the bits of the command signals CMD. The command decoder 131 is a circuit type that receives each bit of the command signals CMD in a differential type. Therefore, the splitter circuit 10a is required in the preceding stage of the command decoder 131 to convert each bit of the command signals CMD into a differential type. If the splitter circuit 10 shown in FIG. 1 is used in this kind of circuit part, the differential signal whose phases are matched is supplied to the command decoder 131. As a result, the operation margin of the command decoder 131 is increased.

Figure 8:
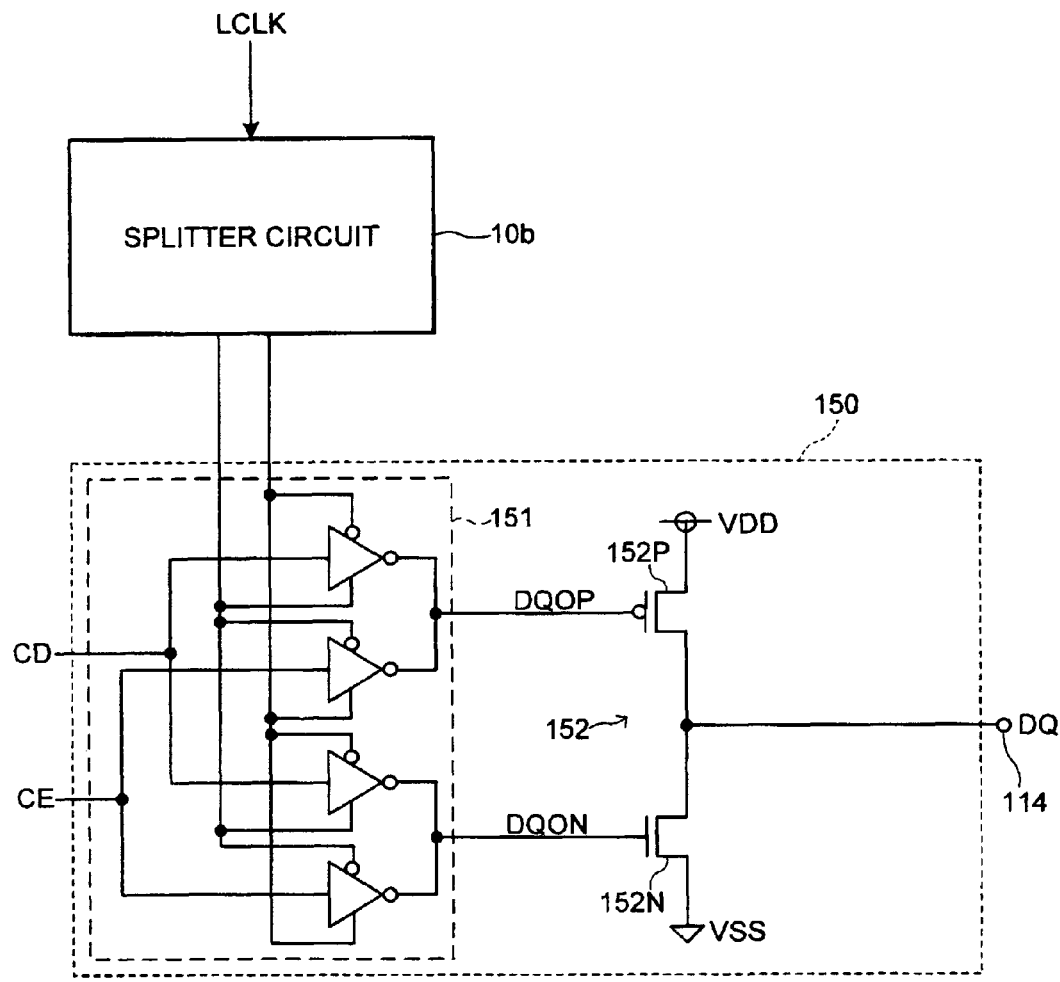
FIG. 8 is a circuit diagram showing main parts of a splitter circuit 10b and a data input/output circuit 150.

FIG. 8 is a circuit diagram showing main parts of the splitter circuit 10b and the data input/output circuit 150. As shown in FIG. 8, the data input/output circuit 150 includes a timing adjusting circuit 151 that synchronizes read data CD and CE with the internal clock signal LCLK, and an output driver 152 that drives the data input/output terminal 114 based on output signals DQOP and DQON of the timing adjusting circuit 151. The output driver 152 is constituted by a P-channel MOS transistor 152P and an N-channel MOS transistor 152N that are serially connected between the power supplies VDD and VSS. The output signals DQOP and DQON are respectively supplied to gate electrodes of the transistors 152P and 152N.

Because the timing adjusting circuit 151 is a circuit that receives the internal clock signal LCLK in a differential type and adjusts rising edges and falling edges of the output signals DQOP and DQON based on the received signal, the splitter circuit 10b is required to convert the internal clock signal LCLK into a differential type. When the splitter circuit 10 shown in FIG. 1 is used in this kind of circuit part, the differential internal clock signal LCLK whose phases are matched is supplied to the timing adjusting circuit 151, thereby improving the signal quality of read data output from the output driver 152.

The internal on-die termination signal IODT that is phase controlled by the internal clock signal LCLK is converted into a differential signal by the splitter circuit 10c, and then supplied to the data input/output circuit 150. The internal on-die termination signal IODT is a signal that causes the data input/output circuit 150 (the data input/output terminal 114 when viewed from outside of a chip) to function as the terminal resistor. Similarly to the output operation of the read data, it is necessary to precisely control an operation timing of the output driver 152. When the splitter circuit 10 shown in FIG. 1 is used in this kind of circuit part, the differential internal on-die termination signal IODT having no deviation in timing is supplied to the data input/output circuit 150, thereby enabling to perform a precise ODT operation.

It is apparent that the present invention is not limited to the above embodiments, but may be modified and changed without departing from the scope and spirit of the invention.

For example, in the present invention, it is not necessary to form two signal paths constituting a splitter circuit using inverters, and some of the inverters can be replaced with other logic circuits (NAND gate circuit, NOR gate circuit or the like).

What is claimed is:

1. A semiconductor device comprising:
   a first inverter that receives an input signal to output an inverted signal;
   a second inverter that receives the inverted signal to output a first output signal; and
   a third inverter that receives the input signal to output a second output signal by using the inverted signal as a power supply, wherein
   the first inverter includes a first one conductivity type transistor and a first opposite conductivity type transistor that are connected in series between first and second power supplies and to whose control electrodes the input signal is commonly supplied,
   the second inverter includes:
      a second one conductivity type transistor and a second opposite conductivity type transistor that are connected in series and to whose control electrodes the inverted signal is commonly supplied;
      a third one conductivity type transistor that is connected between the first power supply and the second one conductivity type transistor; and
      a third opposite conductivity type transistor that is connected between the second power supply and the second opposite conductivity type transistor, and
   the third inverter includes a fourth one conductivity type transistor and a fourth opposite conductivity type transistor, whose power supply terminals are commonly connected to an output terminal of the first inverter and to whose control electrodes the input signal is commonly supplied.

2. The semiconductor device as claimed in claim 1, wherein the third one conductivity type transistor and the third opposite conductivity type transistor are fixed in an on-state.

3. The semiconductor device as claimed in claim 1, wherein
   a series resistance of the first one conductivity type transistor and the fourth one conductivity type transistor is substantially equal to a series resistance of the second one conductivity type transistor and the third one conductivity type transistor, and
   a series resistance of the first opposite conductivity type transistor and the fourth opposite conductivity type transistor is substantially equal to a series resistance of the second opposite conductivity type transistor and the third opposite conductivity type.

4. The semiconductor device as claimed in claim 1, wherein
   the first to fourth one conductivity type transistors are P-channel MOS transistors, and
   the first to fourth opposite conductive transistors are N-channel MOS transistors.

5. The semiconductor device as claimed in claim 4, wherein
   the first to fourth one conductivity type transistors have substantially same channel widths as one another, and
   the first to fourth opposite conductivity type transistors have substantially same channel widths as one another.

6. The semiconductor device as claimed in claim 1, further comprising a command decoder that decodes command signals supplied from outside, wherein
   the input signal represents each bit of the command signals, and
   the first and second output signals are supplied to the command decoder.

7. The semiconductor device as claimed in claim 1, further comprising:
   a clock generation circuit that generates a phase-controlled internal clock signal; and
   an output driver that outputs data to outside in synchronization with the internal clock signal, wherein
   the input signal is the internal clock signal, and
   the first and second output signals are supplied to the output driver.

8. The semiconductor device as claimed in claim 1, further comprising:
   an ODT control circuit that generates a phase-controlled internal on-die termination signal; and
   a data input/output circuit that causes a data input/output terminal to function as a terminal resistor in synchronization with the internal on-die termination signal, wherein
   the input signal is the internal on-die termination signal, and the first and second output signals are supplied to the data input/output circuit.

9. A semiconductor device comprising:
   an input terminal supplied with an input signal;
   first and second output terminals;
   first and second inverters coupled in series between the input terminal and the first output terminal; and
   a third inverter coupled between the input terminal and the second output terminal and operating on an inverted signal of the input signal, wherein
   the first inverter receives the input signal from the input terminal to output the inverted signal of the input signal,
   the first inverter includes first and second power supply nodes supplied with first and second power voltages, respectively,
   the second inverter includes third and fourth power supply nodes supplied with the first and second power voltages, respectively, and
   the third inverter includes fifth and sixth power supply nodes commonly supplied with the inverted signal of the input signal.

10. The semiconductor device as claimed in claim 9, wherein,
    the second inverter receives the inverted signal of the input signal from the first inverter to output a first output signal, and
    the third inverter receives the input signal from the input terminal to output a second output signal.

11. The semiconductor device as claimed in claim 10, wherein the first output signal substantially matches the second output signal in phase.

12. The semiconductor device as claimed in claim 9, wherein each of the first and second power voltages is substantially constant, and the input signal changing in voltage.

13. A semiconductor device comprising:
an input terminal supplied with an input signal that changes in voltage;
a first inverter including a first input node, a first output node, first and second power supply nodes, and first and second transistors connected in series between the first and second power supply nodes, the first input node being coupled to the input terminal to receive the input signal, the first and second power supply nodes being supplied with a first and second substantially constant voltages, respectively, and each of the first and second transistors including a gate node connected to the first input node; and
a second inverter including a second input node, a second output node, third and fourth power supply nodes, and third and fourth transistors connected in series between the third and fourth power supply nodes, the second input node being coupled to the input terminal to receive the input signal, the third and fourth power supply nodes being supplied commonly with an inverted signal of the input signal, and each of the third and fourth transistors including a gate node connected to the second input node.

14. The semiconductor device as claimed in claim 13, further comprising a third inverter including a third input node, a third output node, and fifth and sixth power supply nodes, and fifth and sixth transistors connected in series between the fifth and sixth power supply nodes, the third input node being coupled to the first output node of the first inverter, the fifth and sixth power supply nodes being supplied with the first and second substantially constant voltages, respectively, and each of the fifth and sixth transistors including a gate node connected to the third input node.

15. The semiconductor device as claimed in claim 14, wherein the third inverter further includes a seventh transistor connected between the fifth power supply node and the fifth transistor and an eighth transistor connected between the sixth transistor and the sixth power supply node, the seventh transistor including a gate node supplied with the second substantially constant voltage, and the eighth transistor including a gate node supplied with the first substantially constant voltage.

16. The semiconductor device as claimed in claim 15, wherein each of the first, third, fifth and seventh transistors is a P-conductivity type transistor, and each of the second, fourth, sixth and eighth transistors is an N-conductivity type transistor.

17. The semiconductor device as claimed in claim 13, wherein, each of the first and third transistors is a P-conductivity type transistor, and each of the second and fourth transistors is an N-conductivity type transistor.

18. The semiconductor device as claimed in claim 13, wherein the third transistor comprises a P-conductivity type transistor and the fourth transistor comprises an N-conductivity type transistor.

19. The semiconductor device as claimed in claim 13, wherein the inverted signal of the input signal is output from the first output node.

20. The semiconductor device as claimed in claim 13, wherein the fourth transistor comprises a source that is connected to the first output node.

* * * * *